United States Patent [19]
Duesman et al.

[11] Patent Number: 6,124,195
[45] Date of Patent: Sep. 26, 2000

[54] UTILIZATION OF DIE REPATTERN LAYERS FOR DIE INTERNAL CONNECTIONS

[75] Inventors: Kevin G. Duesman, Boise; Warren M. Farnworth, Nampa, both of Id.

[73] Assignee: Micron Technology, Inc., Boise, Id.

[21] Appl. No.: 09/287,456

[22] Filed: Apr. 7, 1999

Related U.S. Application Data

[62] Division of application No. 09/229,373, Jan. 13, 1999.

[51] Int. Cl.[7] ...................................................... H01L 21/44
[52] U.S. Cl. .......................... 438/601; 438/601; 438/597; 438/598
[58] Field of Search .................................... 438/601, 597, 438/598

[56] References Cited

U.S. PATENT DOCUMENTS

| | | |
|---|---|---|
| 3,461,357 | 8/1969 | Mutter et al. . |
| 3,809,625 | 5/1974 | Brown et al. . |
| 3,881,971 | 5/1975 | Greer et al. . |
| 4,808,552 | 2/1989 | Anderson . |
| 4,988,423 | 1/1991 | Yamamoto et al. . |
| 5,106,461 | 4/1992 | Volfson et al. . |
| 5,130,768 | 7/1992 | Wu et al. ................................... 357/82 |
| 5,231,590 | 7/1993 | Kumar et al. . |
| 5,244,837 | 9/1993 | Dennison . |
| 5,341,310 | 8/1994 | Gould et al. . |
| 5,414,637 | 5/1995 | Bertin et al. . |
| 5,495,397 | 2/1996 | Davidson et al. . |
| 5,506,172 | 4/1996 | Tang . |
| 5,523,253 | 6/1996 | Gilmour et al. ........................... 437/60 |
| 5,523,626 | 6/1996 | Hayashi et al. . |
| 5,534,465 | 7/1996 | Frye et al. ............................... 437/209 |
| 5,570,504 | 11/1996 | DiStefano et al. . |
| 5,597,470 | 1/1997 | Karavakis et al. . |
| 5,619,017 | 4/1997 | Distefano et al. . |
| 5,632,631 | 5/1997 | Fjelstad et al. . |
| 5,640,761 | 6/1997 | DiStefano et al. . |
| 5,666,007 | 9/1997 | Chung . |
| 5,679,609 | 10/1997 | Aimi et al. ............................... 437/205 |
| 5,688,721 | 11/1997 | Johnson . |
| 5,751,031 | 5/1998 | Thompson et al. . |
| 5,904,556 | 5/1999 | Suzuki et al. . |

*Primary Examiner*—Matthew Smith
*Assistant Examiner*—Granvill Lee
*Attorney, Agent, or Firm*—Trask Britt

[57] ABSTRACT

The formation of routing traces on an external surface of a semiconductor device, such as a flip-chip, which has a plurality of ball or bump sites patterned in specific locations, wherein the ball or bumps sites are in electrical communication with external communication traces which are used to route signals from the flip-chip integrated circuitry. Such external communication traces generally result in unused space on the exterior surface of the flip-chip. This unused space can be utilized for forming routing traces to connect portions of the internal circuitry of the flip-chip rather than forming such routing traces internally, for forming routing traces to connect two or more semiconductor dice, or for forming routing traces for use as repair mechanisms.

11 Claims, 13 Drawing Sheets

UTILIZATION OF DIE REPATTERN LAYERS FOR DIE INTERNAL CONNECTIONS

CROSS REFERENCE TO RELATED APPLICATION

This application is a divisional of application Ser. No. 09/229,373, filed Jan. 13, 1999, pending.

BACKGROUND OF THE INVENTION

1. Field of the Invention

The present invention relates to trace formation in the fabrication of semiconductor devices. More particularly, the present invention relates to the formation of routing traces on an external surface of a semiconductor device.

2. State of the Art

Integrated circuit ("IC") devices generally consist of a plurality of components (such as resistors, capacitors, diodes, transistors, fuses, conductors, and the like) fabricated on a single semiconductor chip. Each of these components is electrically isolated from one another by dielectric materials. Thus, in order to interact with one another to form an integrated circuit, a plurality conductive interconnections (hereinafter "traces") must be formed between the components.

FIG. 10 illustrates an exemplary trace configuration connecting a pair of pinch resistors 202A and 202B in series in an IC device. First and second pinch resistors 202A and 202B, respectively, are formed in a p-type substrate 206 by doping n-type regions 208A and 208B, respectively, into the p-type substrate 206. P-type regions 214A and 214B, respectively, are doped into the n-type regions 208A and 208B to reduce the cross-sectional area of the resistor, thereby increasing its respective resistance. A first trace 218A is disposed atop a dielectric layer 222 and routes an electric current to the first pinch resistor 202A through a first contact 224A through the dielectric layer 222. The electric current travels through the first pinch resistor 202A and through a second contact 224B through the dielectric layer 222. A second trace 218B is disposed atop the dielectric layer 222 and is in electrical contact with the second contact 224B. The second trace 218B routes the electric current to the second pinch resistor 202B by a third contact 224C through the dielectric layer 222. The electric current travels through the second pinch resistor 202B and exits through a fourth contact 224D through the dielectric layer 222. A third trace 218C is disposed atop the dielectric layer 222 and is in electrical contact with the fourth contact 224D to route the electric current to other components in the IC device.

Higher performance, lower cost, increased miniaturization of the components comprising the IC devices, and greater packaging density of IC devices are ongoing goals of the computer industry. The advantages of increased miniaturization of components include: reduced-bulk electronic equipment, improved reliability by reducing the number of solder or plug connections, lower assembly and packaging costs, and improved circuit performance. In pursuit of increased miniaturization, IC devices have been continually redesigned to achieved ever-higher degrees of integration which has reduced the size of the IC device. However, as the dimensions of the IC devices are reduced, the geometry of the components and circuit elements has also decreased. Moreover, as components become smaller and smaller, tolerances for all semiconductor structures (such as circuitry traces, contacts, dielectric thickness, and the like) become more and more stringent. Although the reduction in size creates technical problems, the future advancement of the technology requires such size reductions.

Of course, the reduction in component size and density packing (smaller component-to-component spacing) of the components in the IC devices has resulted in a greatly reduced area for running traces to interconnect the components. Furthermore, the integration and densification process in IC devices has caused the continuous migration of traces and connections, which were previously routed on printed circuit boards, cards, and modules, to the IC device itself, yet further reducing potential area for forming traces. Thus, multilevel metallization has become a technique to cope with the reduced area. Multilevel metallization is a technique of forming traces on different layers of dielectric material over the components. FIG. 11 illustrates an exemplary four-tier metallization structure 240. The metallization structure 240 shows an active area 242 formed in a semiconductor substrate 244 which is in electrical communication with a first level trace 246A, such as aluminum, tungsten, titanium, or various alloys thereof. The first level trace 246A is disposed over a first level barrier layer 248A, such as a silicon nitride layer, which is over the semiconductor substrate 244. A first level dielectric layer 252A is disposed over the first level trace 246A and the exposed first level barrier layer 248A. A second level barrier layer 248B is disposed over the first level dielectric layer 252A and a second level trace 246B is formed on the second level barrier layer 248B. The first level trace 246A and the second level trace 246B are in electrical communication through a first-to-second level contact 258A which extends through the first level dielectric layer 252A and the second level barrier layer 248B.

A second level dielectric layer 252B is disposed over the second level trace 246B and the exposed second level barrier layer 258A. A third level barrier layer 248C is disposed over the second level dielectric layer 252B and a third level trace 246C is formed on the third level barrier layer 248C. The second level trace 246B and the third level trace 246C are in electrical communication through a second-to-third level contact 258B which extends through the second level dielectric layer 252B and the third level barrier layer 248C.

A third level dielectric layer 252C is disposed over the third level trace 246C and the exposed third level barrier layer 258B. A fourth level barrier layer 248D is disposed over the third level dielectric layer 252C and a fourth level trace 246D is formed on the fourth level barrier layer 248D. The third level trace 246C and the fourth level trace 246D are in electrical communication through a third-to-fourth level contact 258C which extends through the third level dielectric layer 252C and the fourth level barrier layer 248D.

A fourth level dielectric layer 252D is disposed over the fourth level trace 246D and the exposed fourth level barrier layer 258C. The upper surface 284 of the fourth level dielectric layer 252D is used to form bond pads 286 in specific locations and external communication traces 288 conduct input/output signals to solder balls 292. The solder balls 292 will be connected to external devices, such as a printed circuit board, to relay input/output signals therebetween.

FIG. 12 is a top view of the metallization structure 240 of FIG. 11 prior to the addition of solder balls 292. As FIG. 12 illustrates, the bond pads 286 are patterned in specific locations for active surface-down mounting to contact sites of metal conductors of a carrier substrate (not shown), such as a printed circuit board, FR4, or the like, wherein the contact sites are a mirror-image of the bond pads 286 pattern on the metallization structure 240. It is, of course, understood that although the bond pads 286 are illustrated as substantially square, they can be of any shape, including round, as shown as round bond pad 294.

Although multilayer metallization is effective in compensating for reduced areas for trace patterning, the thickness of the IC device is also a concern. Therefore, it can be appreciated that it would be advantageous to develop a technique which would maximize the available area on an IC device for patterning traces for the interconnection of IC device components, without adding additional layers to the multilayer structure.

SUMMARY OF THE INVENTION

The present invention relates to the formation of routing traces on an external surface of a semiconductor device. In an exemplary method of the present invention, a flip-chip is provided which has an active surface bearing a plurality of bonds pads upon which minute solder balls or other conductive material elements are to be disposed. The bond pads are patterned in specific locations for active surface-down mounting to contact sites of metal conductors of a carrier substrate, such as a printed circuit board, wherein the contact sites are a mirror-image of the bond pad pattern on the flip-chip. The bond pads are in electrical communication with external communication traces which are used to route signals from the flip-chip integrated circuitry. Such external communication traces generally result in unused space on the exterior surface of the flip-chip. This unused space can be utilized for forming routing traces for the internal circuitry of the flip-chip rather than forming such routing traces internally.

Another embodiment of the present invention comprises using routing traces to connect two or more substantially adjacent semiconductor dice. A first semiconductor die and a second semiconductor die are placed in one or more recesses in a semiconductor carrier. The first semiconductor die and the second semiconductor die are substantially flush with a top surface of the semiconductor carrier. An appropriate filler material is utilized to fill any gaps between the walls of the recesses and the semiconductor dice placed therein. The filler material may be usually planarized to be substantially flush with the first and second semiconductor dice, and the semiconductor carrier top surface. With such a configuration, routing traces can be patterned over the surfaces of the semiconductor carrier and the filler material to interconnect the first and second semiconductor dice.

Yet another embodiment of the present invention comprises using routing traces as repair mechanisms. A series of routing traces can be used as deactivation mechanisms on a semiconductor device. When a defective portion of a semiconductor device is detected during a testing procedure, a routing trace can be physically severed to deactivate the defective portion. With some applications, the deactivation will result in the activation a of redundant circuit to take over for the defective circuit. In other applications, the deactivation of a defective portion of a semiconductor device will simply deactivate the defective portion of the semiconductor device.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

FIGS. 1–9 illustrate various trace configurations on a contact surface of a semiconductor device according to the present invention. It should be understood that the illustrations are not meant to be actual views of any particular semiconductor IC device, but are merely idealized representations which are employed to more clearly and fully depict the present invention than would otherwise be possible. Additionally, elements and features common to FIGS. 1–9 retain the same numerical designation.

Figure 1:
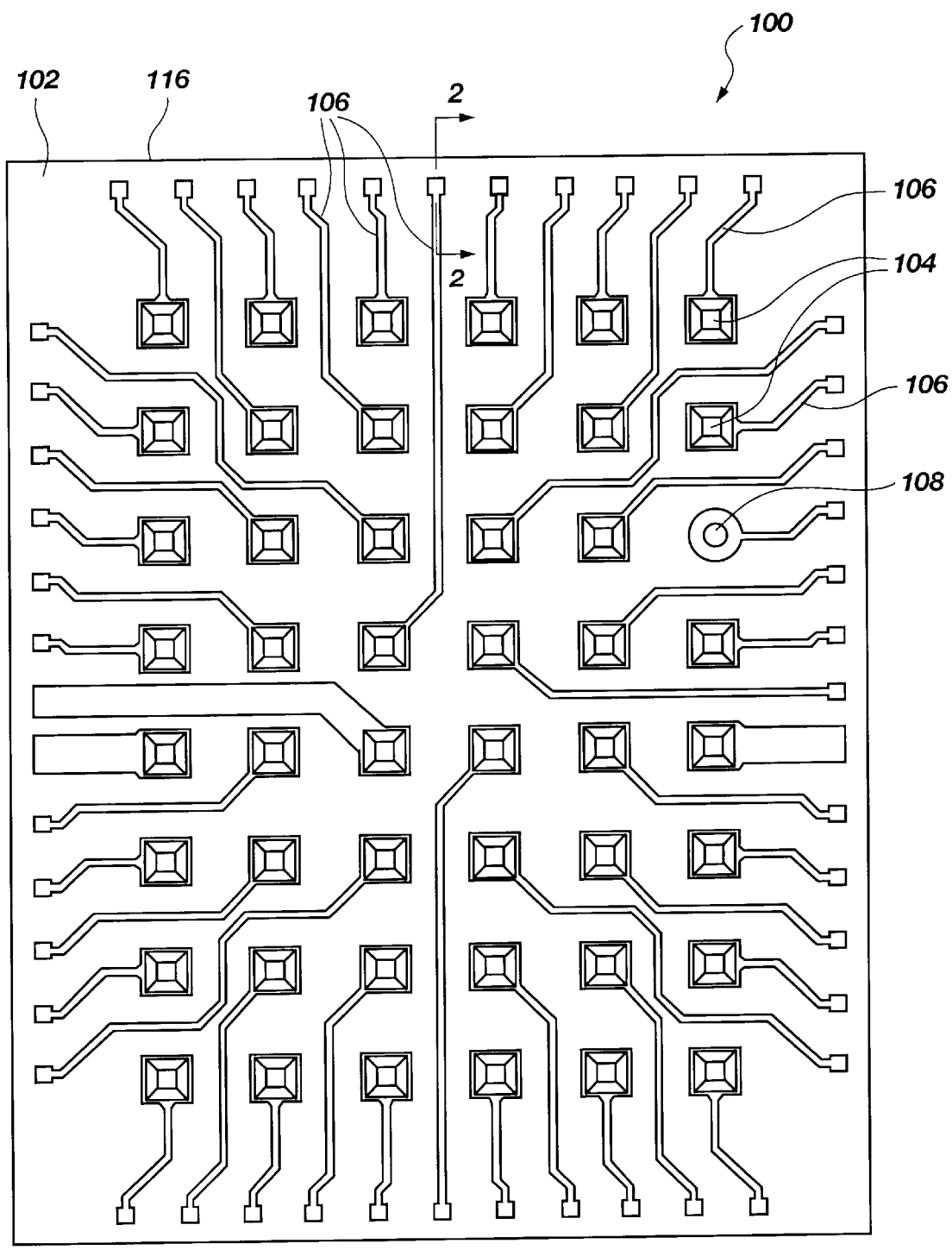
FIG. 1 is a top plan view of an active surface of a prior art flip-chip.

FIG. 1 shows a top plan view of an active surface 102 for a flip-chip 100. The active surface 102 includes a plurality of ball or bump sites 104 upon which minute solder balls or other conductive material elements (not shown) are to be disposed. The ball or bump sites 104 are patterned in specific locations for active surface-down mounting to contact sites of metal conductors of a carrier substrate (not shown), such as a printed circuit board, wherein the contact sites are a mirror-image of the ball or bump sites 104 pattern on the flip-chip 100. The ball or bump sites 104 are in electrical communication with external communication traces 106 which are used to route power to and signals to and from the flip-chip 100 integrated circuitry (not shown—i.e., below the active surface 102). It is, of course, understood that although the ball or bump sites 104 are illustrated as substantially square, they may be of any shape, including round, as shown as round ball site 108.

Figure 2:
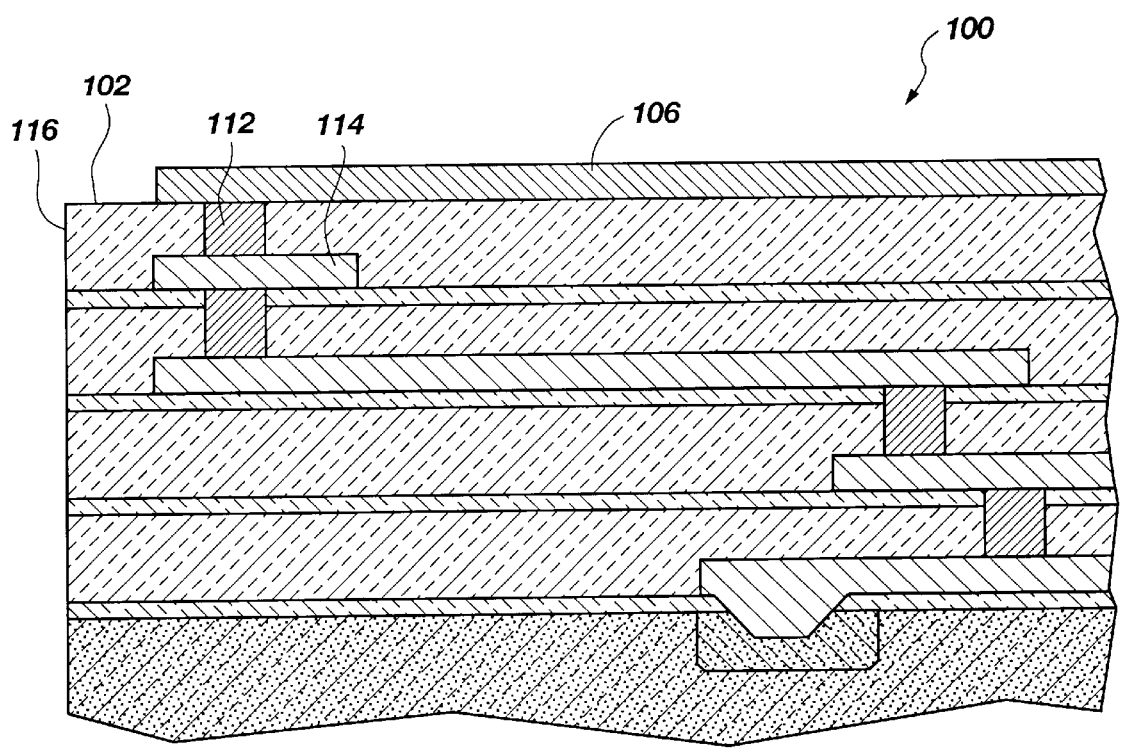
FIG. 2 is a side cross-sectional view of the prior art flip-chip along line 2—2 of FIG. 1.

FIG. 2 shows a side cross-sectional view along line 2—2 of FIG. 1 which shows a contact 112 making an electrical connection between the external communication trace 106 and an internal trace 114 within the flip-chip 100. Although FIG. 1 shows all of the external communication traces 106 routing from contacts 112 (see FIG. 2) which are about peripheral edges 116 of the flip-chip 100, it is understood that each contact 112 (see FIG. 2) could be positioned anywhere to extend through to the active surface 102 of the flip-chip 100.

Figure 3:
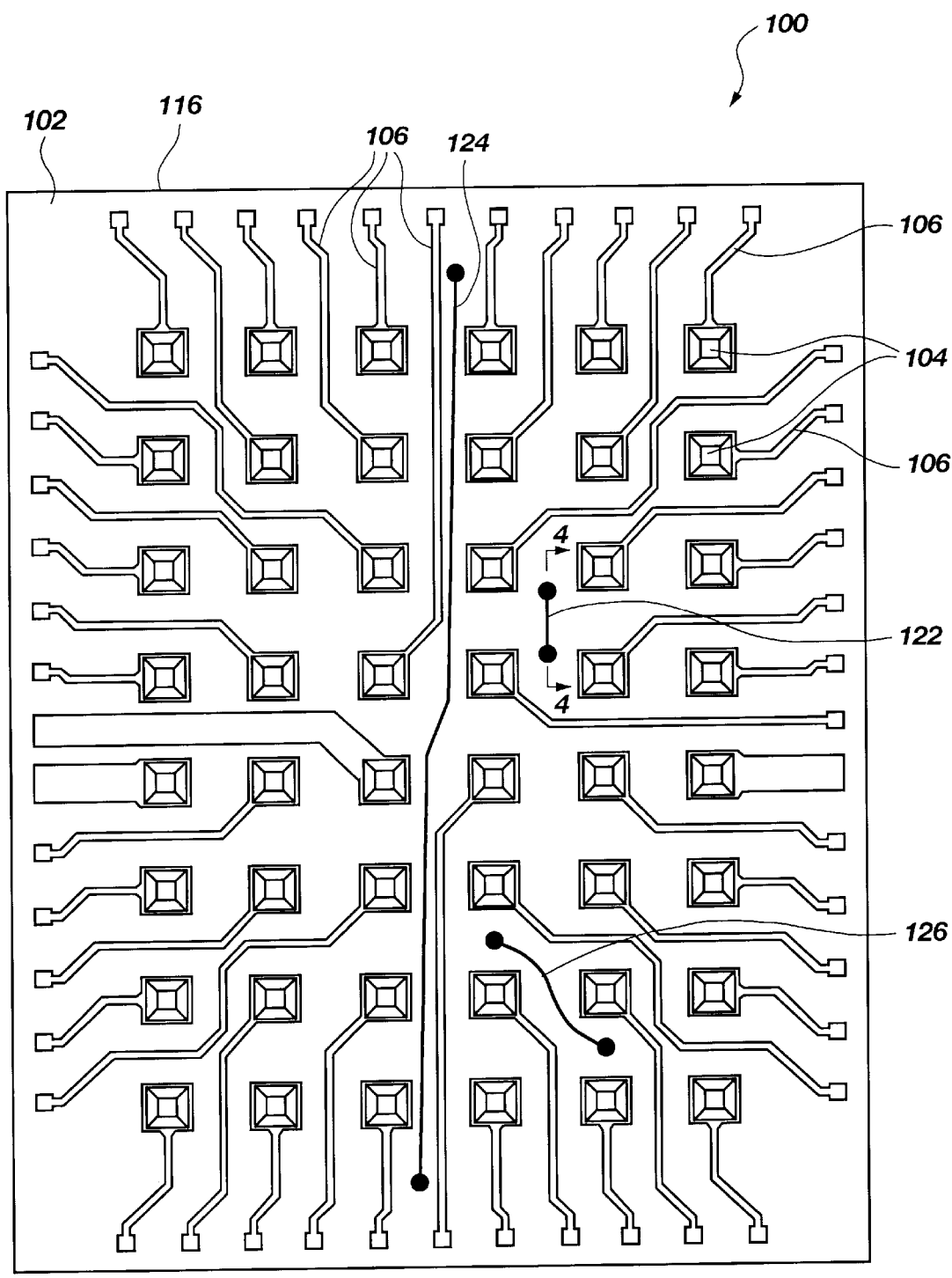
FIG. 3 is a top plan view of a flip-chip which has its active surface utilized as an addition layer for routing traces for the circuitry within the flip-chip according to the present invention.

Referring again to FIG. 1, it can be seen that a majority of the area of the active surface 102 is not used in positioning the ball or bump sites 104 with the external communication traces 106. Thus, these unused areas are utilized as an additional surface for routing traces for the circuitry within the flip-chip 100. FIG. 3 illustrates three such routing traces: a first routing trace 122, a second routing trace 124, and a third routing trace 126. It is, of course, understood that the routing trace (e.g., 122, 124, and 126) can be considerably smaller (thinner in width and/or height) than the external communication traces 106, since the routing traces generally require substantially less current than the external communication traces 106. External communication traces 106 route power to and signals to and from an external device (not shown) which, for output signals, requires amplifying the original signal within the semiconductor device to a sufficiently strong signal for external communication. The ball or bump sites 104, the external communication traces 106, and the routing traces 122, 124, and 126 may be formed in separate steps or simultaneously formed by various methods, including, but not limited to:

1) Coating the semiconductor die active surface 102 with a metal, such as aluminum, copper, gold, silver, and alloys thereof, forming a mask with a photoresist by exposing the photoresist to react in a specific pattern, washing the unreacted photoresist off of the semiconductor die active surface, and etching the metal through the photoresist, thereby forming the ball or bump sites 104, the external communication traces 106, and the routing traces 122, 124, and 126;

2) Coating the semiconductor die active surface 102 with a conductive photopolymer, exposing the photopolymer to react it in a specific pattern, and washing the unreacted photopolymer, thereby forming the ball or bump sites 104, the external communication traces 106, and the routing traces 122, 124, and 126; and 3) Screen printing conductive or conductor-carrying polymer on the semiconductor die active surface 102, thereby forming the ball or bump sites 104, the external communication traces 106, and the routing traces 122, 124, and 126.

Figure 4A:
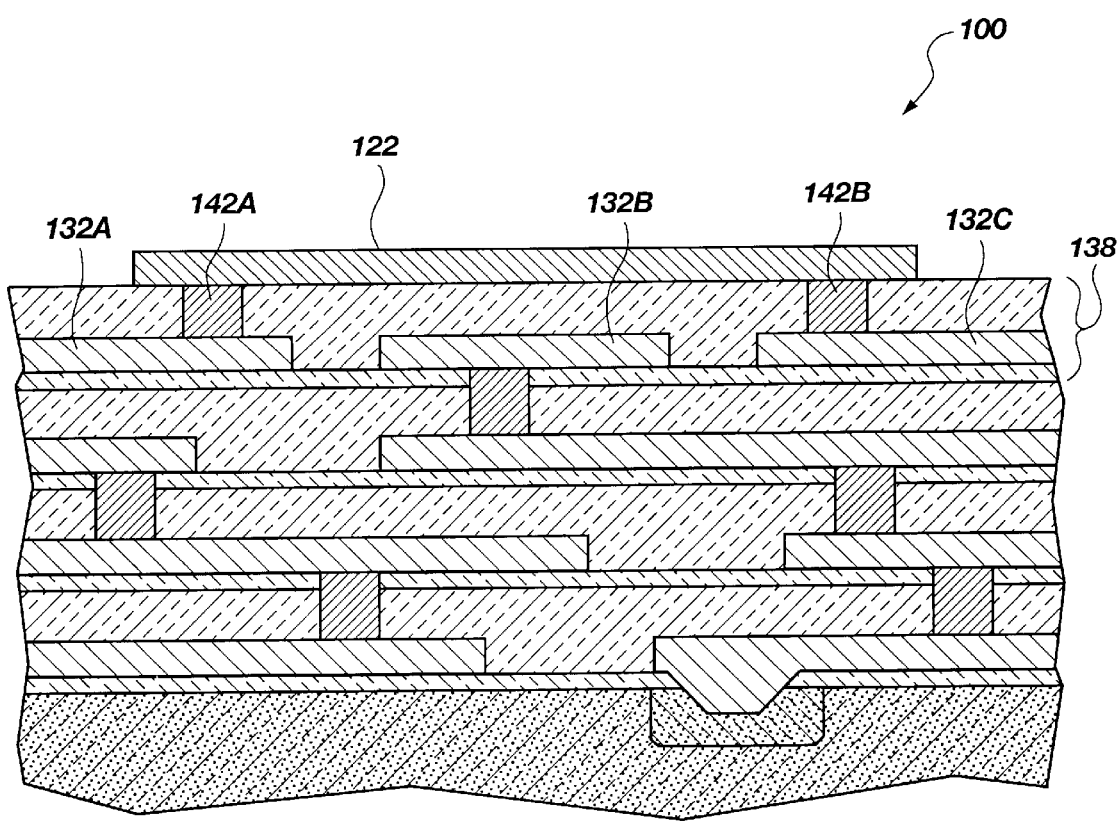
FIGS. 4a and 4b are side cross-sectional views of two embodiments of routing traces along line 4—4 in FIG. 3 according to the present invention.
Figure 4B:
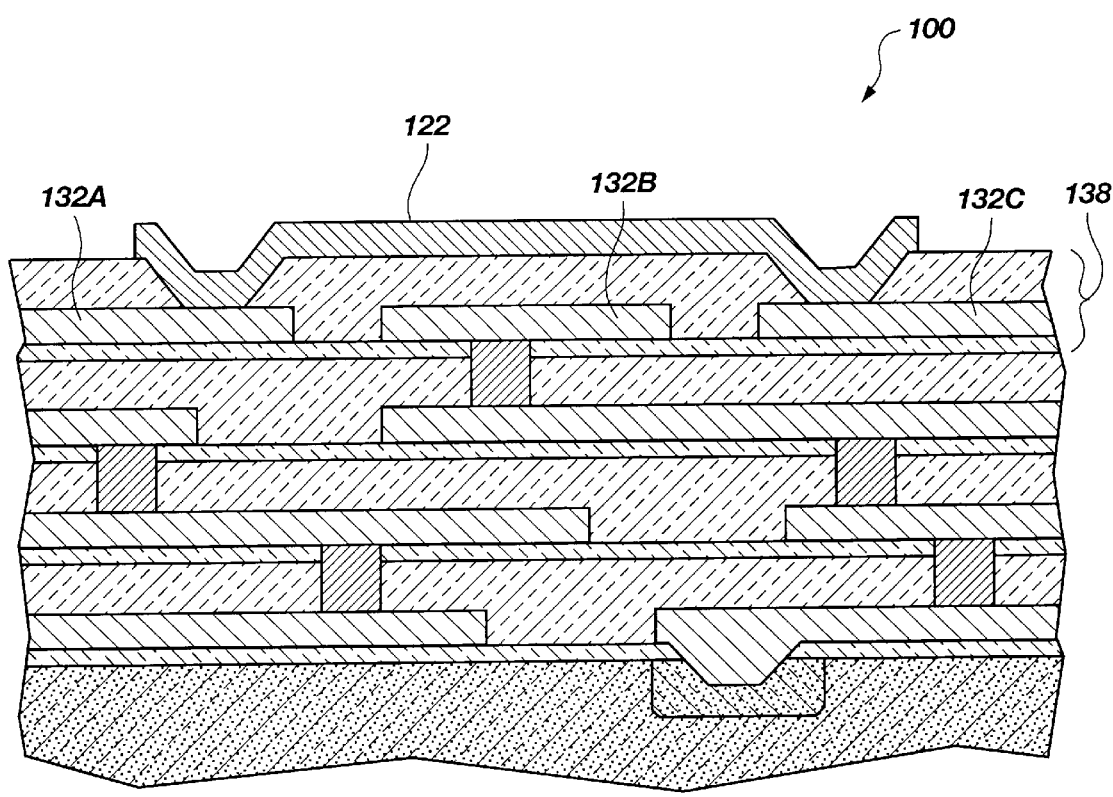

The first routing trace 122 is an example of a short "jumping" trace. Referring to FIGS. 4A–4B, the path for connecting first internal trace 132A with second internal trace 132C is blocked by a lateral trace 132B which is running perpendicular to the plane of the cross-section on a fourth level 138 of the multilevel structure of the flip-chip 100. A first internal trace-to-first trace contact 142A is formed to connect the first internal trace 132A with the first routing trace 122 and a first trace-to-second internal trace contact 142B is formed to connect the first routing trace 122 with the second internal trace 132C, thereby "jumping" the lateral trace 132B.

The second routing trace 124 (FIG. 3) extends substantially the length of the flip-chip 100. Such a routing trace is very advantageous for components in electrical communication with one another, but which are widely spaced from one another. If such a routing trace were not available, the components could be connected internally, which would likely require a lengthy, serpentine route shifting from layer to layer in the multilayer structure of the flip-chip 100. The direct route of the second routing trace 124 greatly reduces the overall length of the trace, thereby decreasing the time required for signals to travel between the components, and reduces the capacitance due to a reduction of the amount of metal required. The third routing trace 126 illustrates that the routing traces can be patterned to "snake" around the ball or bump sites 104 and external communication traces 106.

Figure 5:
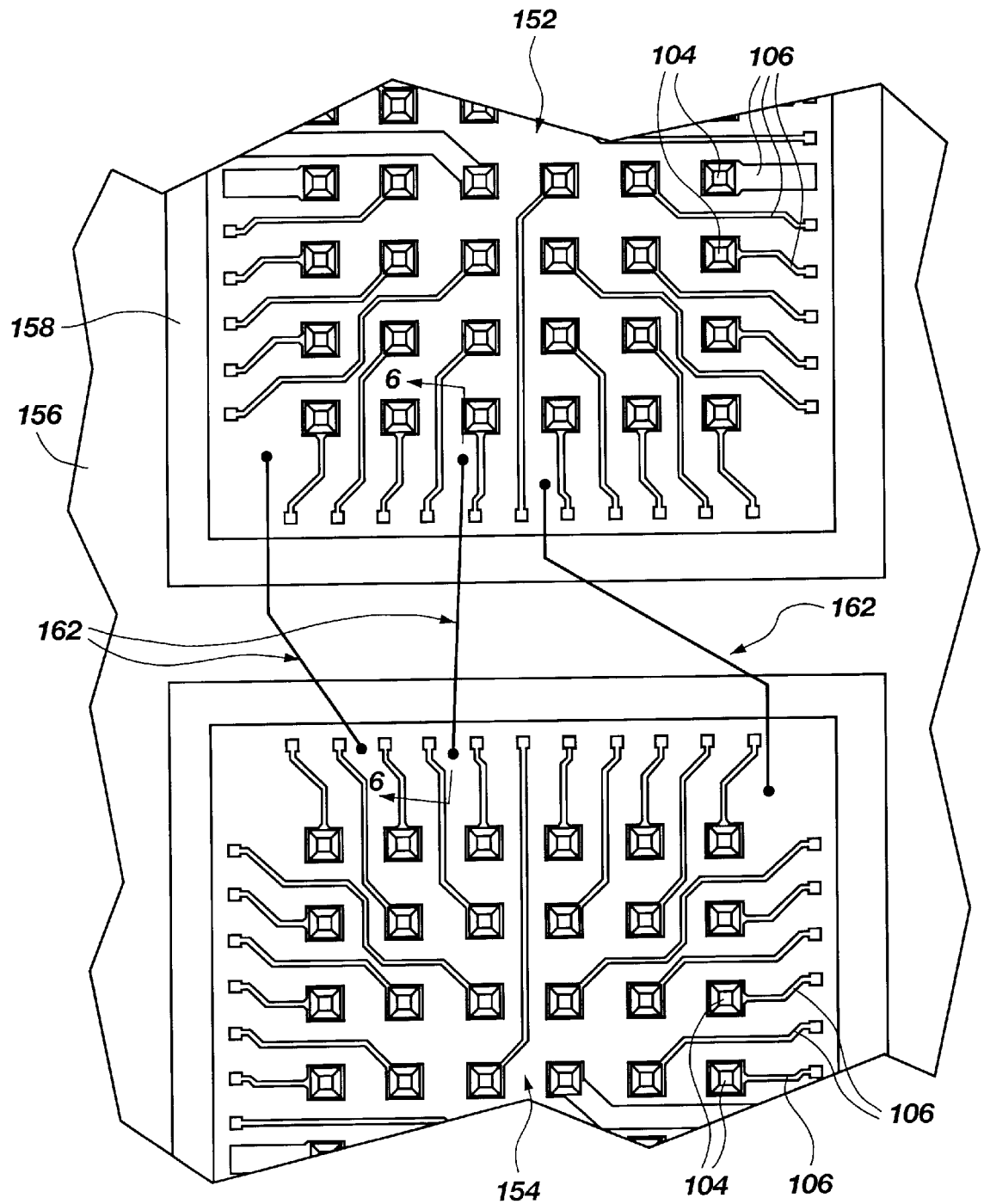
FIG. 5 is a top plan view of two flip-chips interconnected with routing traces according to the present invention.
Figure 6:
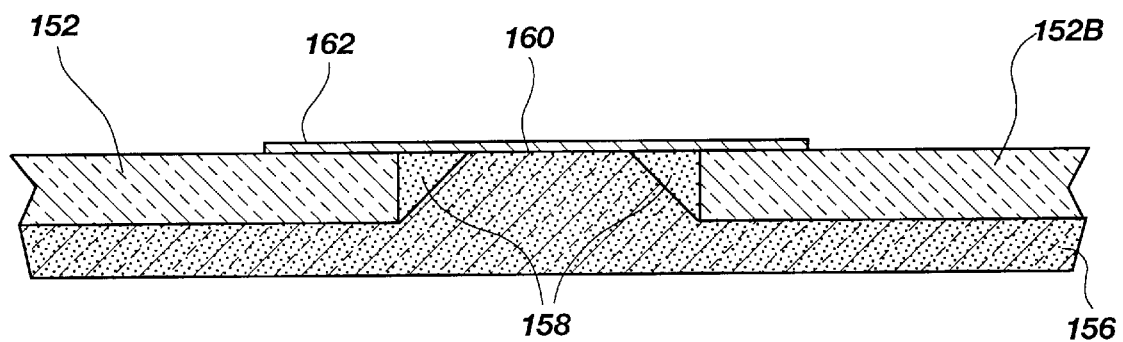
FIG. 6 is a side cross-sectional view of a routing trace along line 6—6 of FIG. 5 according to the present invention.

Another embodiment of the present invention comprises using routing traces to connect two or more semiconductor dice, as illustrated in FIGS. 5 and 6. FIG. 5 illustrates a first semiconductor die 152 and a second semiconductor die 152B placed in separate recesses in a semiconductor carrier 156. The semiconductor carrier 156 can be made of silicon, ceramic material, or even metal with a surface of insulative material etched to form recesses having sloped walls. However, the semiconductor carrier 156 should have a coefficient of thermal expansion (CTE) which is similar to the CTE of the semiconductor dice and filler, so that the heat expansion and contraction does not break the routing traces.

As shown in FIG. 6 (a cross-sectional view of FIG. 5 along line 6—6), the first semiconductor die 152 and the second semiconductor die 152B are substantially flush with a top surface 160 of the semiconductor carrier 156. An appropriate filler material 158, such as "filled" epoxies or silicones, is utilized to fill any gaps in the recess. The filler material 158 is preferably planarized to be substantially flush with the first and second semiconductor dice 152 and 152B, and the semiconductor carrier top surface 160. However, if the filler material 158 is planarized, the ball or bump sites, the external communication traces, and the routing traces must be formed thereafter. With such a configuration, routing traces 162 can be patterned to interconnect the first and second semiconductor dice 152 and 152B.

Figure 7:
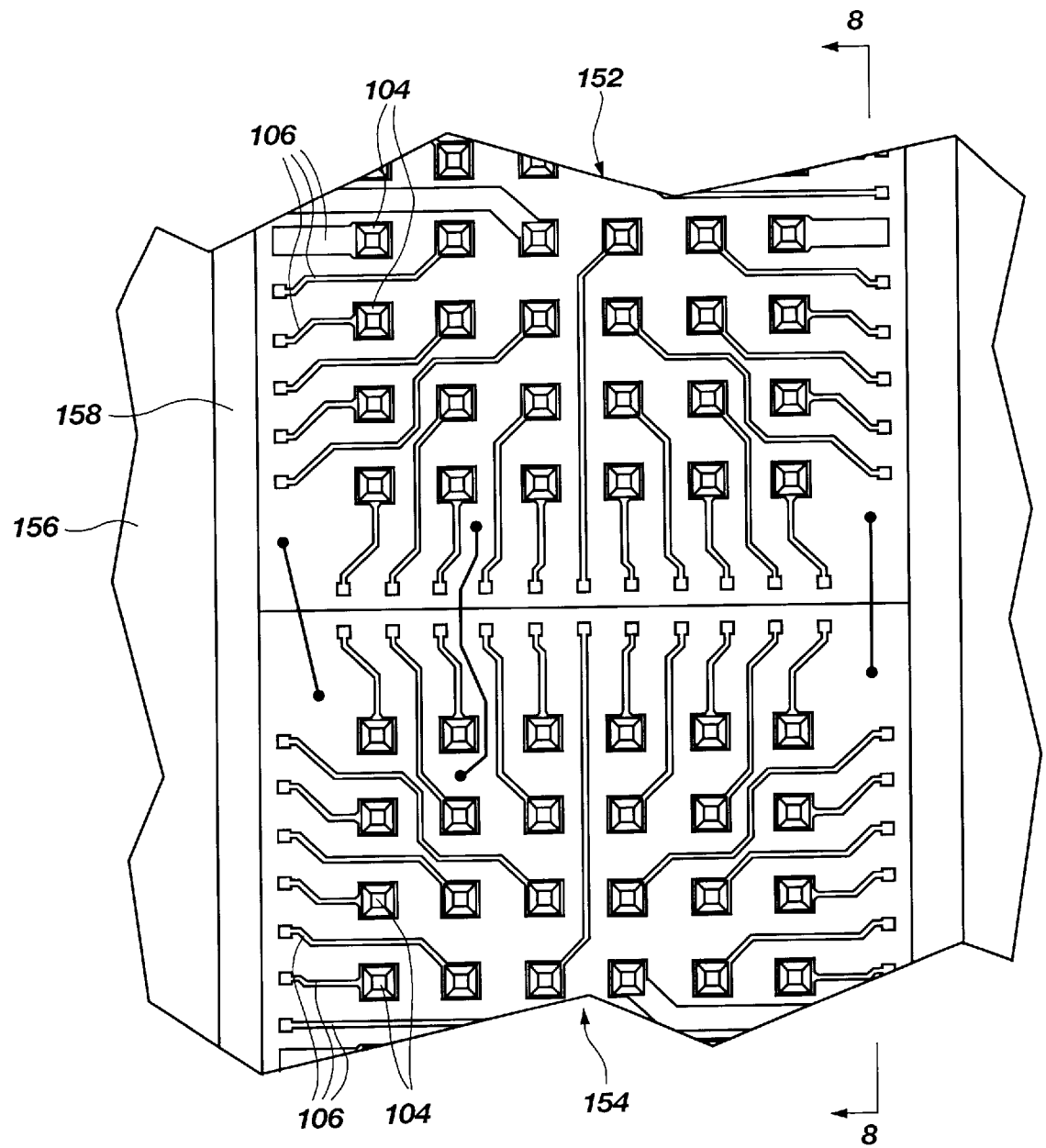
FIG. 7 is a top plan view of two flip-chips interconnected with routing traces according to the present invention.
Figure 8:
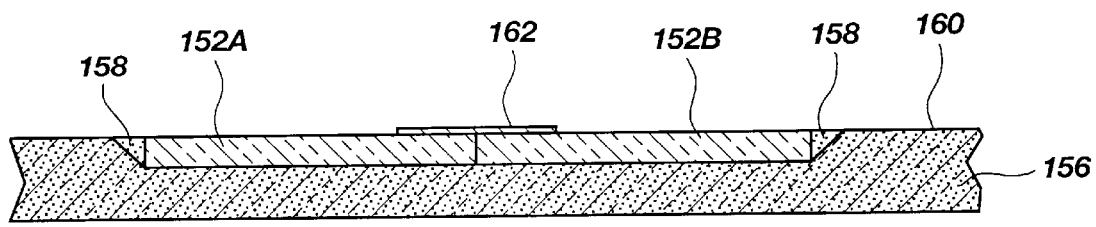
FIG. 8 is a side cross-sectional view of a routing trace along line 8—8 of FIG. 7 according to the present invention.

Yet another embodiment of the present invention comprises using routing traces to connect two or more semiconductor dice, as illustrated in FIGS. 7 and 8. FIG. 7 illustrates the first semiconductor die 152 and a second semiconductor die 154 placed in a single recess in a semiconductor carrier 156, wherein the first semiconductor die 152 and the second semiconductor die 154 abut one another. As shown in FIG. 8 (a cross-sectional view of FIG. 7 along line 8—8), the first semiconductor die 152A and the second semiconductor die 152B are substantially flush with a top surface 160 of the semiconductor carrier 156. An appropriate filler material 158 is utilized to fill any gaps in the recess. The filler material 158 is usually planarized to be substantially flush with the first and second semiconductor dice 152A and 152B, and the semiconductor carrier top surface 160. With such a configuration, routing traces 162 can be patterned to interconnect the first and second semiconductor dice 152A and 152B. An insulative spacer (not shown) may be disposed between the first and second semiconductor dice 152A and 152B to prevent shorting therebetween.

The embodiments illustrated in FIGS. 5–8 considerably simplify inter-semiconductor dice communication. Previously, if inter-semiconductor dice communication was required, a signal from the first semiconductor die would have to be amplified and sent from an interconnection out of the first semiconductor die and through a external communication trace to a bond pad. The bond pad would be connected to an carrier substrate, such as a printed circuit board, FR4, or the like, with a solder ball, conductive epoxy pillar, or the like. The carrier substrate would, in turn, route the signal through a trace to a solder ball connected to a bond pad on a second semiconductor device. The signal would then be directed by an external communication trace to an interconnection into the second semiconductor device. This embodiment reduces or may eliminate any requirement for signal amplification and the necessity of using the valuable space which would be required by the additional external communication traces and bond pads on both the first and second semiconductor dice, as well as the additional trace on the external carrier substrate. Furthermore, this embodiment allows for faster transmission of signals between the two semiconductor dice and reduces capacitance by reducing the amount of metal required to form the connections. This embodiment also eliminates the use of an interposer board with yet another set of solder balls to a higher level carrier.

Figure 9:
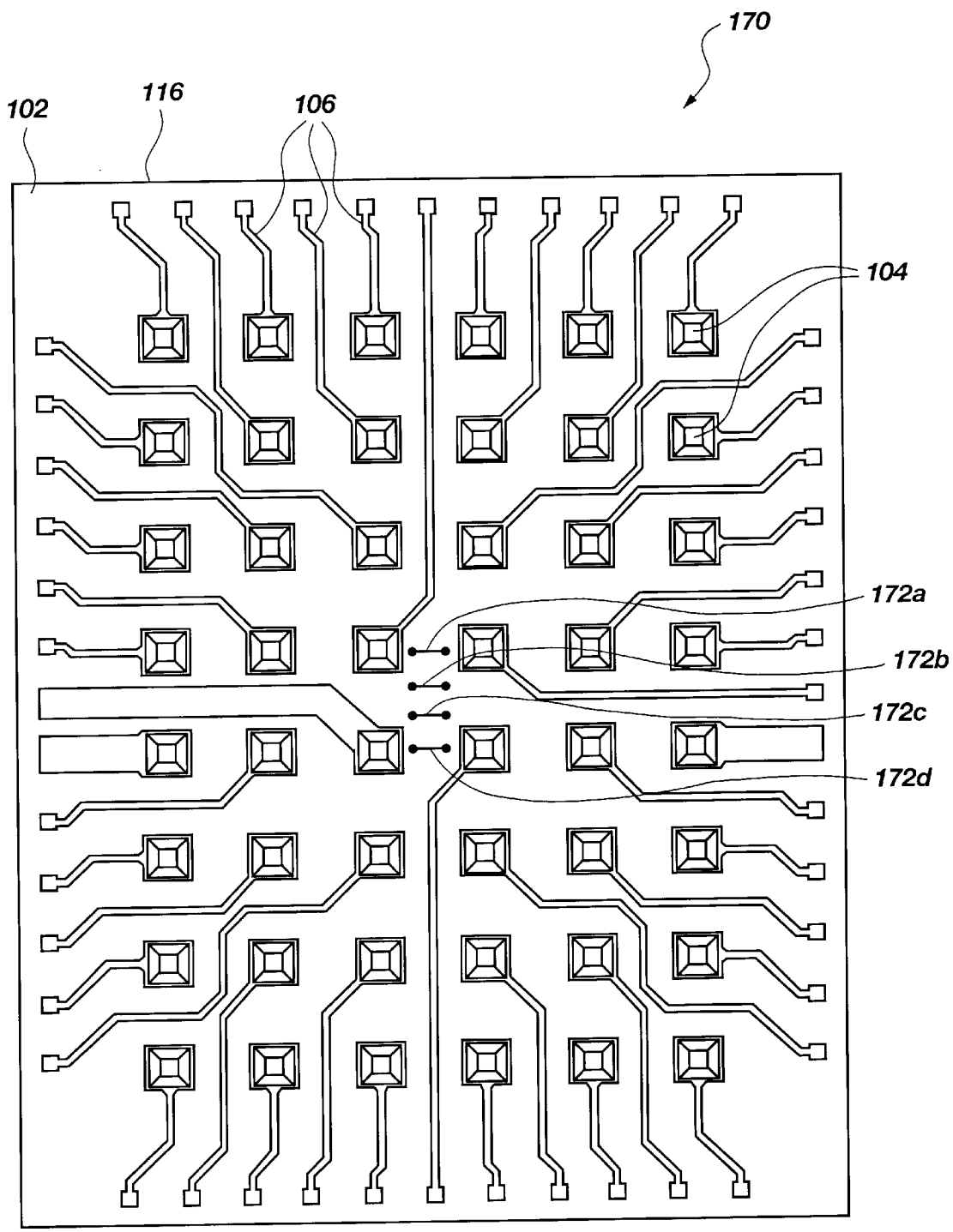
FIG. 9 is a top plan view of routing traces utilized as deactivation mechanisms according to the present invention.
Figure 10:
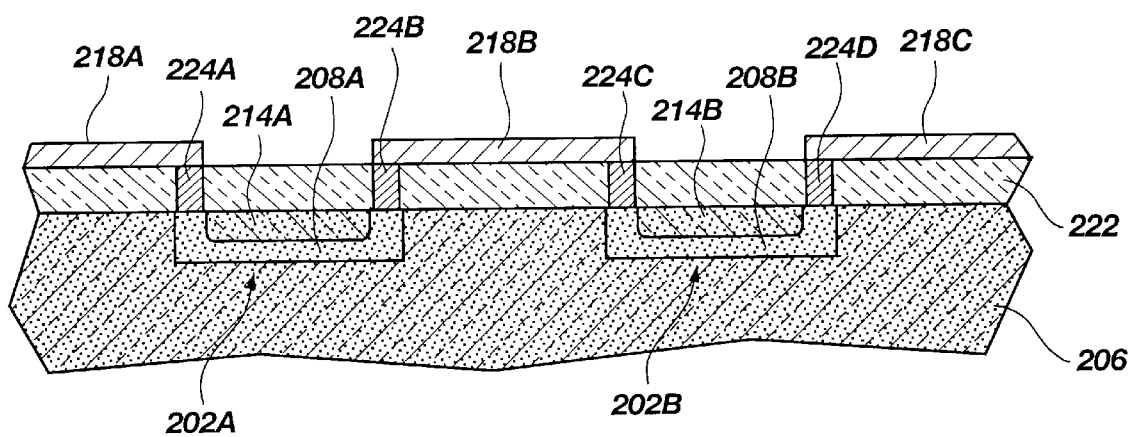
FIG. 10 is a side cross-sectional view of a prior art pinched resistor pair.
Figure 11:
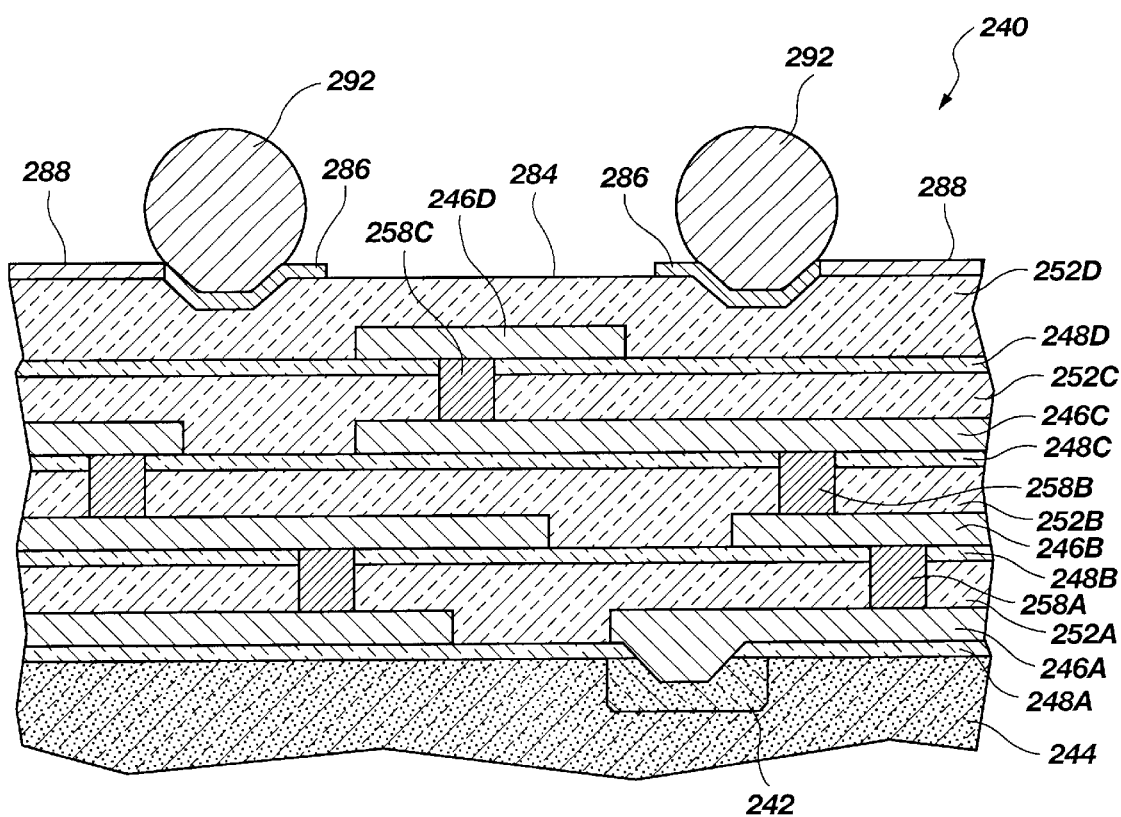
FIG. 11 is a side cross-sectional view of a prior art metallization structure.
Figure 12:
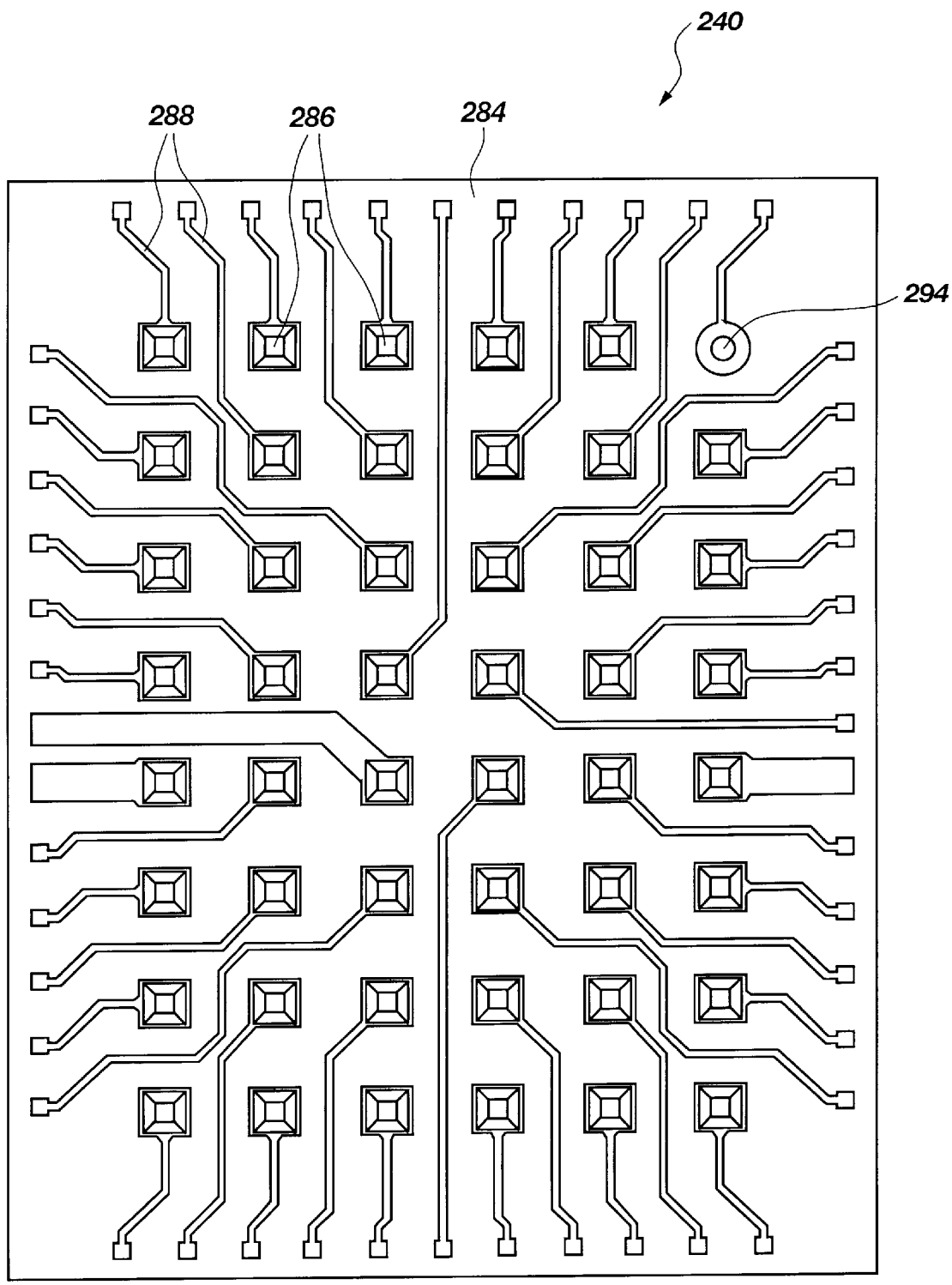
FIG. 12 is a top plan view of the prior art metallization structure of FIG. 10.

Yet another embodiment of the present invention comprises using routing traces as repair mechanisms. As shown in FIG. 9, a series of traces 172*a–d* can be used as deactivation mechanisms on a semiconductor device 170. When a defective portion of a semiconductor device is detected during a testing procedure, a trace (shown as trace 172*d*) can be physically severed to deactivation the defective portion. With some applications, this deactivation will result in the activation of a redundant circuit to take over for the defective circuit. In other applications, this deactivation of a defective portion of a semiconductor device will simply deactivate the defective portion of the semiconductor device. For example, in a memory chip, this deactivation will result in isolation of defective storage capacity on the memory chip.

Prior art fuses are programming devices which are blown by a tester to isolate area on a chip. However, blowing these fuses can cause damage to the chip. The repair mechanisms shown in FIG. 9 function to isolate a short or a latched-up area without risking damage to the chip.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of forming a semiconductor device, comprising:

providing a semiconductor chip having at least one active surface;

forming a plurality of external communication traces over said at least one active surface and positioning each of said plurality of external communication traces to direct signals between internal circuitry of said semiconductor chip and a site over said at least one active surface for connection with external components; and forming at least one routing trace over an area of said at least one active surface unoccupied by said plurality of external communication traces and laterally spaced therefrom, and positioning said at least one routing trace to connect a first internal circuit component to a laterally remote second internal circuit component of said semiconductor chip.

2. The method of claim 1, wherein said forming said plurality of external communication traces and said forming said at least one routing trace occur substantially simultaneously.

3. A method of forming a semiconductor device, comprising:

providing a plurality of laterally adjacent semiconductor chips, each having at least one active surface;

forming a plurality of external communication traces over said at least one active surface of each of said plurality of laterally adjacent semiconductor chips and positioning each of said plurality of external communication traces to direct signals between internal circuitry of each of said plurality of laterally adjacent semiconductor chips and a laterally remote site on said at least one active surface of each of said plurality of lateraaly adjacent semiconductor chips for connection with external components; and forming at least one routing trace over an area of said at least one active surface unoccupied by said plurality of external communication traces of one of said plurality of laterally adjacent semiconductor chips and laterally spaced from said plurality of external communication traces thereof, and extending said at least one routing trace to an area of said at least one active surface unoccupied by said plurality of external communication traces of another of said plurality of laterally adjacent semiconductor chips to effect an electrical connection between at least one internal circuit component of said one of said plurality of laterally adjacent semiconductor chips and at least one internal circuit component of said another of said plurality of laterally adjacent semiconductor chips.

4. The method of claim 3, wherein said forming said plurality of external communication traces and said forming said at least one routing trace occur substantially simultaneously.

5. The method of claim 3, further including:

providing a carrier having an upper surface with at least one recess therein to receive said plurality of laterally adjacent semiconductor chips, wherein said at least one recess allows substantial alignment of said upper surface of said carrier with said at least one active surface of each of said plurality of laterally adjacent semiconductor chips.

6. The method of claim 5, further including:

disposing a filler material in gaps between walls of said at least one recess and each of said plurality of laterally adjacent semiconductor chips disposed therein.

7. The method of claim 3, wherein said carrier includes a plurality of recesses.

8. A method of forming a semiconductor device, comprising:

providing a semiconductor chip having at least one active surface;

forming a plurality of external communication traces over said at least one active surface to direct signals between internal circuitry of said semiconductor chip and a laterally remote site on said at least one active surface for connection with external components;

forming at least one routing trace including a repair mechanism to extend between two laterally remote circuit portions of said semiconductor chip over an area of said at least one active surface unoccupied by said plurality of external communication traces and laterally spaced therefrom.

9. The method of claim 8, wherein said forming said plurality of external communication traces and said forming said at least one routing trace occur substantially simultaneously.

10. The method of claim 8, further including severing said at least one routing trace of said repair mechanism to activate a selected internal circuit in said semiconductor chip.

11. The method of claim 8, further including severing said at least one routing trace of said repair mechanism to deactivate a selected internal circuit in said semiconductor chip.

* * * * *

UNITED STATES PATENT AND TRADEMARK OFFICE
CERTIFICATE OF CORRECTION

PATENT NO. : 6,124,195
DATED : September 26, 2000
INVENTOR(S) : Kevin G. Duesman and Warren M. Farnworth It is certified that error appears in the above-identified patent and that said Letters Patent is hereby corrected as shown below:

Title page,
Item [57], ABSTRACT,
Line 4, change "bumps" to -- bump --

Drawings,
FIG. 5, change "152" to -- 152A -- and change "154" to -- 152B --
FIG. 6, change "152" to -- 152A --
FIG. 7, change "152" to -- 152A -- and change "154" to -- 152B --

Column 1,
Line 60, change "achieved" to -- achieve --

Column 2,
Line 35, change "258A" to -- 248B --
Line 44, change "258B" to -- 248C --
Line 53, change "258C" to -- 248D --

Column 3,
Line 56, change "activation a of" to -- activation of a --

Column 4,
Line 6, change "addition" to -- additional --

Column 5,
Line 1, change "PIG." to -- FIG. --
Line 25, after "react" insert -- it --
Line 48, after "first" insert -- internal --

Column 6,
Line 4, change "152" to -- 152A --
Line 14, change "152" to -- 152A --
Line 20, change "152" to -- 152A --
Line 26, change "152" to -- 152A --
Line 31, change "152" to -- 152A --
Line 32, change "154" to -- 152B --
Line 33, change "152" to -- 152A --
Line 34, change "154" to -- 152B --
Line 53, change "a" to -- an --
Line 55, change "an" to -- a --

UNITED STATES PATENT AND TRADEMARK OFFICE
CERTIFICATE OF CORRECTION

PATENT NO. : 6,124,195
DATED : September 26, 2000
INVENTOR(S) : Kevin G. Duesman and Warren M. Farnworth It is certified that error appears in the above-identified patent and that said Letters Patent is hereby corrected as shown below:

Column 7,
Line 12, change "deactivation" to -- deactivate --
Line 22, change "area" to -- areas --

Column 8,
Line 1, change "lateraaly" to -- laterally --
Line 35, change "claim 3," to -- claim 5, --

Signed and Sealed this

Thirteenth Day of August, 2002

Attest:

JAMES E. ROGAN
Attesting Officer       Director of the United States Patent and Trademark Office